(12) United States Patent
Zhai

(10) Patent No.: US 11,522,039 B2
(45) Date of Patent: Dec. 6, 2022

(54) STRETCHABLE DISPLAY PANEL AND DISPLAY DEVICE

(71) Applicant: Xiamen Tianma Micro-Electronics Co.,Ltd., Xiamen (CN)

(72) Inventor: Yingteng Zhai, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 132 days.

(21) Appl. No.: 17/097,042

(22) Filed: Nov. 13, 2020

(65) Prior Publication Data
US 2022/0085130 A1 Mar. 17, 2022

(30) Foreign Application Priority Data
Sep. 16, 2020 (CN) .......................... 202010971131.X

(51) Int. Cl.
*H01L 27/32* (2006.01)
*G06F 3/041* (2006.01)
*G06F 3/044* (2006.01)
*H01L 51/00* (2006.01)

(52) U.S. Cl.
CPC .......... *H01L 27/3276* (2013.01); *G06F 3/044* (2013.01); *G06F 3/0412* (2013.01); *H01L 27/323* (2013.01); *H01L 51/0097* (2013.01); *G06F 2203/04102* (2013.01); *H01L 2251/5338* (2013.01)

(58) Field of Classification Search
CPC ................... G06F 3/044; G06F 3/0412; G06F 2203/04102; G06F 3/0448; G06F 3/04164; H01L 51/0097; H01L 27/323; H01L 27/3276; H01L 2251/5338; Y02E 10/549
See application file for complete search history.

(56) References Cited

U.S. PATENT DOCUMENTS
2018/0046221 A1* 2/2018 Choi .................. G02B 26/0825

FOREIGN PATENT DOCUMENTS
CN 110658952 A 1/2020
CN 110851028 A 2/2020

* cited by examiner

*Primary Examiner* — Yaron Cohen
(74) *Attorney, Agent, or Firm* — Anova Law Group, PLLC

(57) ABSTRACT

A stretchable display panel and a display device are provided in the present disclosure. The stretchable display panel includes a plurality of display islands arranged in an array and a plurality of stretch bridges each connecting to two adjacent display islands, and further includes a display function layer and a touch control electrode layer. The display function layer and the touch control electrode layer are both disposed on a display island of the plurality of display islands; and an orthographic projection of the touch control electrode layer on the display island at least partially surrounds an orthographic projection of the display function layer on the display island.

19 Claims, 13 Drawing Sheets

STRETCHABLE DISPLAY PANEL AND DISPLAY DEVICE

CROSS-REFERENCE TO RELATED APPLICATION

This application claims the priority of Chinese Patent Application No. 202010971131.X, filed on Sep. 16, 2020, the content of which is incorporated herein by reference in its entirety.

TECHNICAL FIELD

The present disclosure generally relates to the field of display technology and, more particularly, relates to a stretchable display panel and a display device.

BACKGROUND

With continuous development of electronic display technology, users have higher requirements for the displays of electronic devices. Flexible electronic devices and stretchable electronic devices have been developed in recent years. Flexible electronic devices, which can be bent or folded, are manufactured by bonding electronic units on flexible base substrates. The stretchable electronic devices are devices whose lengths can increase in one or more dimensions. The stretchable electronic devices play an important role in various applications including display devices and sensor arrays. Therefore, as one of the important development trends of the displays of electronic devices, the stretchable displays have gradually gained in more popularity.

The stretchable display may be stretched according to its original planar shape while maintaining the image quality. Such feature makes the stretchable display not only suitable for eye-catching mobile phones, but also having practical functions for wearable display devices such as watches, fitness trackers, and the like. For the existing technology, when a touch control function is integrated into the stretchable display, the display reliability and touch control reliability of the stretchable display may be easily affected while the stretchable display panel meets the requirement for a relatively high degree of stretchability.

Therefore, there is a need to develop a stretchable display panel and a display device that can not only satisfy the stretching performance, but also improve the display reliability and touch control reliability.

SUMMARY

One aspect of the present disclosure provides a stretchable display panel. The stretchable display panel includes a plurality of display islands arranged in an array and a plurality of stretch bridges each connecting to two adjacent display islands; and further includes a display function layer and a touch control electrode layer. The display function layer and the touch control electrode layer are both disposed on a display island of the plurality of display islands; and an orthographic projection of the touch control electrode layer on the display island at least partially surrounds an orthographic projection of the display function layer on the display island.

Another aspect of the present disclosure provides a display device, including a stretchable display panel. The stretchable display panel includes a plurality of display islands arranged in an array and a plurality of stretch bridges each connecting to two adjacent display islands; and further includes a display function layer and a touch control electrode layer. The display function layer and the touch control electrode layer are both disposed on a display island of the plurality of display islands; and an orthographic projection of the touch control electrode layer on the display island at least partially surrounds an orthographic projection of the display function layer on the display island.

Other aspects of the present disclosure can be understood by those skilled in the art in light of the description, the claims, and the drawings of the present disclosure.

BRIEF DESCRIPTION OF THE DRAWINGS

Drawings incorporated in the specification and forming a part of the specification demonstrate the embodiments of the present disclosure and, together with the specification, describe the principles of the present disclosure.

DETAILED DESCRIPTION

Figure 1:
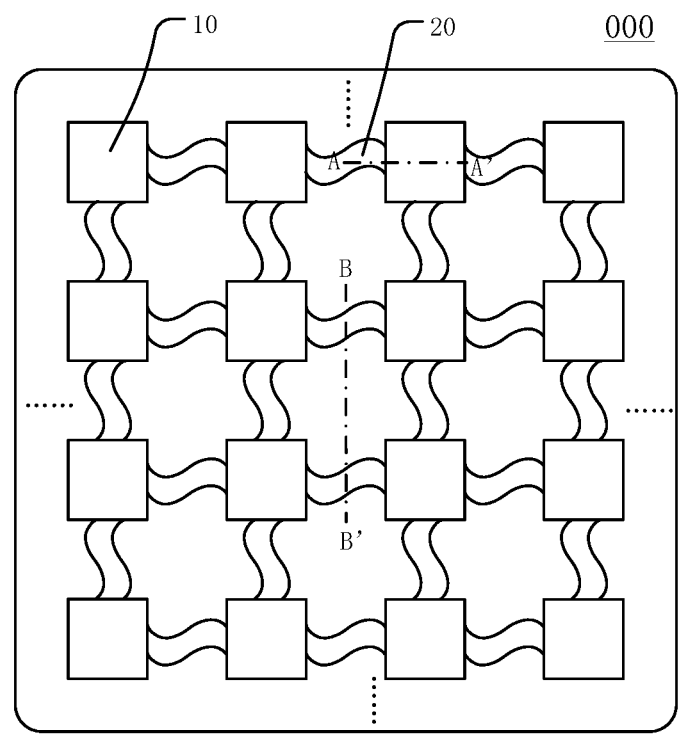
FIG. 1 illustrates a planar structural schematic of a stretchable display panel according to various embodiments of the present disclosure.

Various embodiments of the present disclosure are described in detail with reference to the drawings. It should be noted that the relative arrangement of components and steps, numerical expressions, and numerical values set forth in the embodiments may not limit the scope of the present disclosure unless specifically stated otherwise.

The following description of at least one exemplary embodiment is merely illustrative, which may not limit the present disclosure and its application or use.

Techniques, methods and equipment known to those skilled in the art may not be discussed in detail, but where appropriate, the techniques, methods and equipment should be considered as a part of the specification.

In all exemplary embodiments shown and discussed herein, any specific values should be interpreted as merely exemplary and not limiting. Therefore, other examples of the exemplary embodiments may have different values.

It should be noted that similar reference numerals and letters indicate similar items in the following drawings. Therefore, once an item is defined in one drawing, there is no need to discuss it further in subsequent drawings.

The detailed description is given in conjunction with the drawings and various embodiments hereinafter.

Figure 2:
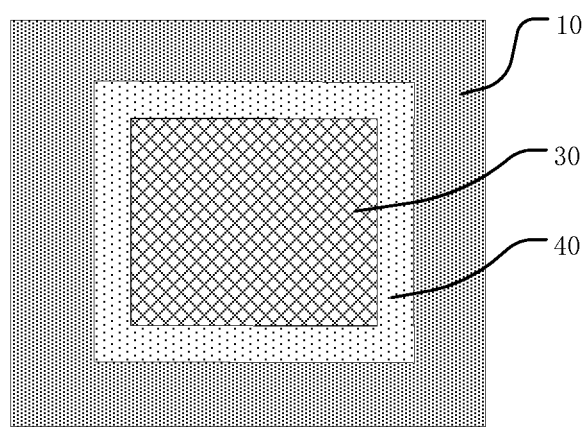
FIG. 2 illustrates an enlarged schematic of a display island in FIG. 1.
Figure 3:
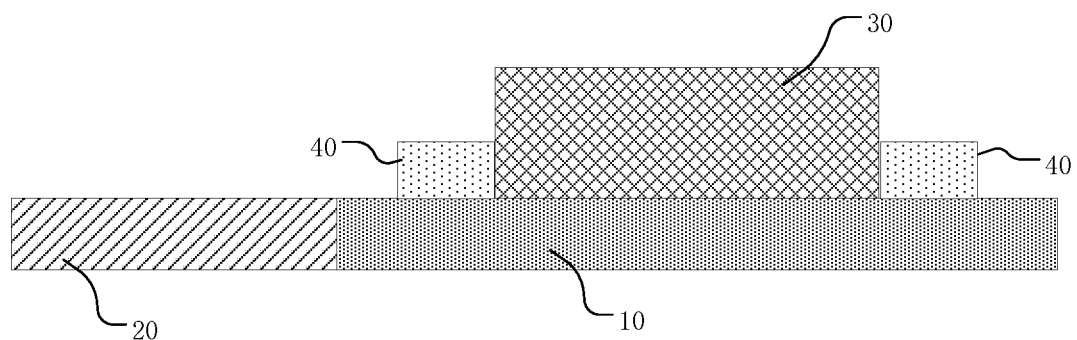
FIG. 3 illustrates a local cross-sectional structural schematic along an AA' direction in FIG. 1.

Referring to FIGS. 1-3, FIG. 1 illustrates a planar structural schematic of a stretchable display panel according to various embodiments of the present disclosure; FIG. 2 illustrates an enlarged schematic of a display island in FIG. 1; and FIG. 3 illustrates a local cross-sectional structural schematic along an AA' direction in FIG. 1. It should be noted that FIG. 3 in one embodiment may only exemplarily illustrate a cross-sectional schematic of a portion of the film layer of the display island and a stretch bridge, which may not limit the cross-sectional structure of the stretchable display panel. A stretchable display panel 100, provided in one embodiment, may include a plurality of display islands 10 arranged in an array and a plurality of stretch bridges 20 connecting to two adjacent display islands 10.

The stretchable display panel may further include a display function layer 30 and a touch control electrode layer 40. The display function layer 30 and the touch control electrode layer 40 may both disposed on the display island 10, and the orthographic projection of the touch control electrode layer 40 on the display island 10 may at least partially surround the orthographic projection of the display function layer 30 on the display island 10.

For example, referring to FIG. 1, the stretchable display panel 100 may include the plurality of display islands 10 arranged in an array and the plurality of stretch bridges 20 connecting between the display islands 10. The display island 10 may be configured to dispose the display function layer 30 and the touch control electrode layer 40 to implement the display function and the touch control function, and the stretch bridge 20 may be configured to implement the stretching function of the stretchable display panel. Optionally, the stretch bridge 20 may be between any two adjacent display islands 10, and each display island 10 may be a separate structure. One end of the stretch bridge 20 may be connected to one display island 10, and the other end of the stretch bridge 20 may be connected to another display island 10, thereby implementing the connection between two adjacent display islands 10. That is, two adjacent display islands 10 may be discrete from each other through a gap or slit between the two adjacent display islands 10; and the two adjacent display islands 10 discrete from each other may be connected by the stretch bridge 20.

In the display panel having the touch control function, if the touch control electrode layer is disposed on the side of the display function layer away from the display island, on the route of disposing the touch control signal line connected to the touch control electrode layer, the touch control signal line may need to pass through the steps formed by inorganic layers in the display function layer to implement the connection with the touch control electrode layer, which may likely break the touch control line. In addition, the touch control electrode layer and the display function layer may overlap along the direction where film layers are stacked, and the signals of the touch control electrode layer and the display function layer may interfere with each other, which affects the display reliability and touch control reliability of the stretchable display panel.

In order to solve above-mentioned problems in one embodiment, referring to FIGS. 1-3, while the display function layer 30 and the touch control electrode layer 40 are both disposed on the display island 10, the orthographic projection of the touch control electrode layer 40 on the display island 10 may at least partially surround the orthographic projection of the display function layer 30 on the display island 10 in the present disclosure, such that it may avoid that the touch control signal line connected to the touch control electrode layer 40 passes through the steps formed by the display function layer 30; and the touch control electrode layer 40 and the display function layer 30 may not overlap or slightly overlap along the direction perpendicular to the display island 10. Therefore, the breakage possibility of the touch control signal line may be reduced, and the crosstalk possibility between the touch control signal in the touch control electrode layer 40 and the display signal in the display function layer 30 may be effectively reduced, which is beneficial for improving the display reliability and touch control reliability of the stretchable display panel. Meanwhile, there is no need to separately provide the island structure for the touch control electrode layer 40, which is also beneficial for simplifying the manufacturing process and improving the production efficiency.

Figure 4:
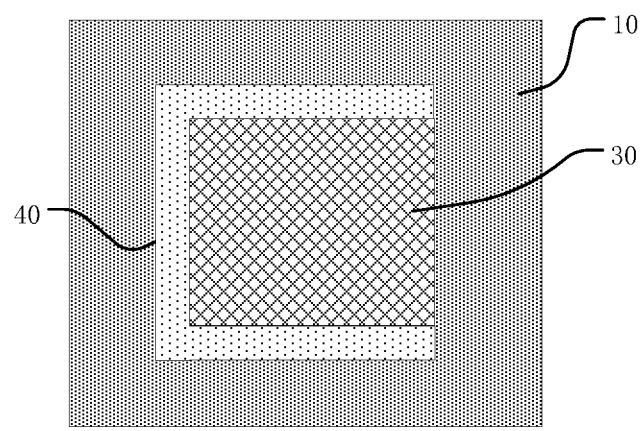
FIG. 4 illustrates another enlarged schematic of a display island in FIG. 1.

It should be noted that FIG. 2 only illustrates a situation that the touch control electrode layer 40 is disposed by surrounding the display function layer 30. In some other embodiments of the present disclosure, the touch control electrode layer 40 may also partially surround the display function layer 30; for example, referring to FIG. 4, FIG. 4 illustrates another enlarged schematic of the display island 10 in FIG. 1. In one embodiment, FIG. 3 only exemplarily illustrates a cross-sectional schematic of a portion of the film layer of the display island 10 and the stretch bridge 20, and the rectangular structure is taken as an example to illustrate the display function layer 30 and the touch control electrode layer 40, which may not limit the cross-sectional structure of the stretchable display panel. Optionally, the display function layer 30 of the stretchable display panel may further include a buffer layer, various insulation layers, a light-emitting device layer, a planarization layer, a pixel definition layer (not shown in FIG. 3), and the like disposed on the display island 10. The light-emitting device layer in the display function layer may include a light-emitting unit and a drive circuit (not shown) connected to the light-emitting unit to implement the display function of the stretchable display panel. The stretchable display panel may further include a gate drive circuit and may be connected to a drive chip. The structure of the stretchable display panel may be understood with reference to the structure of the stretchable display panel in the existing technology, which may not be described in detail in one embodiment herein. Optionally, the material of the touch control electrode layer 40 in the present disclosure may include at least one of Ti, Al, and Mo.

It should be noted that FIG. 3 only illustrates the situation that the display island 10 includes one-layer structure. In some other embodiments of the present disclosure, the display island 10 may also be embodied as a stacked structure of multiple film layers. For example, the display island 10 may include a stacked structure of an organic layer and an inorganic layer, where the inorganic layer may include at least one of silicon nitride, silicon oxide, and metal oxide (e.g., aluminum oxide); and the organic layer may include at least one of organic materials such as acrylic, polyimide, polyester, and the like.

The film layer of the display panel 10 adjacent to the display function layer 30 may be set as an organic layer, and the film layer of the display panel 10 away from the display function layer 30 may be set as an inorganic layer. The inorganic layer is disposed on the side of the organic layer away from the display function layer 30, such that the display island 10 may have a certain rigidity, which avoids the stretching and deformation of the display island 10. The organic layer is disposed on the side of the inorganic layer adjacent to the display function layer 30, such that the signal line may reliably contact the organic layer when a signal line is disposed on the display island 10, which is beneficial for reducing the breakage risk of the signal line.

FIG. 3 only illustrates the situation that the stretch bridge 20 includes one-layer structure. In some other embodiments of the present disclosure, the stretch bridge 20 may include a stacked structure of film layers such as an organic layer, an inorganic layer, a wiring layer, and the like. The inorganic layer may include at least one of silicon nitride, silicon oxide, and metal oxide (e.g., aluminum oxide); and the organic layer may include at least one of organic materials such as acrylic, polyimide, polyester, and the like. It should be noted that, at the present disclosure, certain film layers in the stretch bridge may be disposed at a same layer as certain film layers in the display island. For example, the inorganic layer in the stretch bridge may be formed at a same layer as the inorganic layer in the display island, and such two layers may be formed into a single piece. In such way, the formation of such two layers may be completed in a same manufacturing process, which is beneficial for simplifying the manufacturing process of the stretchable display panel.

Figure 5:
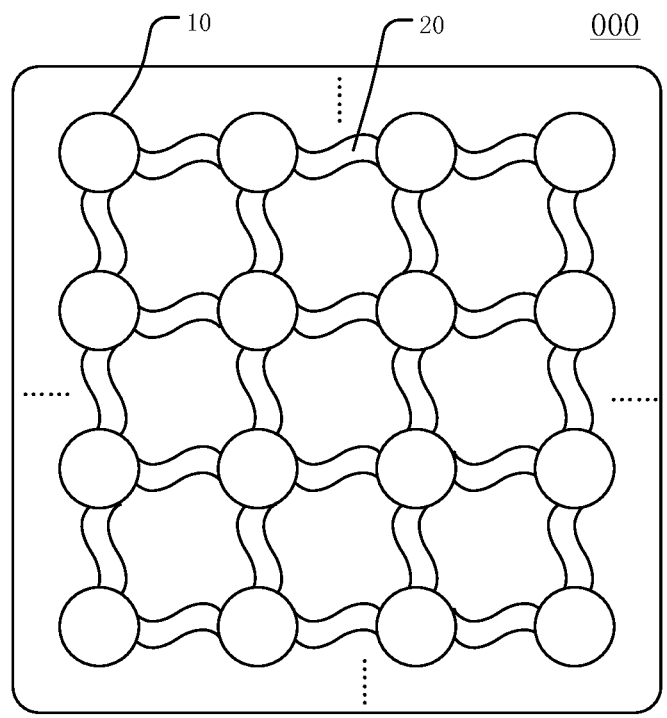
FIG. 5 illustrates another planar structural schematic of a stretchable display panel according to various embodiments of the present disclosure.

Furthermore, FIG. 1 only takes the squared top-view structure of the display island 10 in the stretchable display panel as an example. In certain other embodiments of the present disclosure, the top view structure of the display island 10 may also be embodied in a shape including a circle, an ellipse, and/or other suitable shape (e.g., the circular structure in FIG. 5), which may not be limited according to the embodiments of the present disclosure. FIG. 5 illustrates another planar structural schematic of a stretchable display panel according to various embodiments of the present disclosure.

Optionally, the stretch bridge 20 in one embodiment may a serpentine bridge, that is, a wave-shaped bridge. In an un-stretched state, the bending status of the stretch bridge 20 may be serpentine. When the stretchable display panel is not stretched, the stretch bridge 20 may naturally shrinks into a serpentine curl shape; and when the stretchable display panel is stretched, the stretch bridge 20 may be stretched straight. The stretch bridge 20 may be maximum stretched to an approximate straight line, such that the gap between the display islands 10 may increase. However, the size and shape of each display island 10 may not change to ensure that the display function layer 30, the touch control electrode layer 40, and the like on the display island 10 may not be damaged. It may be understood that the display island 10 having a square or circular structure may be taken as an example for description at the present disclosure, but the shape of the display island 10 may not be limited according to the embodiments of the present disclosure. In other embodiments, the display island 10 may be an ellipse and/or other suitable shape. The shape of the stretch bridge 20 in one embodiment may not be limited to the serpentine bridge shown in FIG. 1 and FIG. 5. In other embodiments, the shape of the stretch bridge 20 may also be spring-like, wave-like, and the like.

Figure 6:
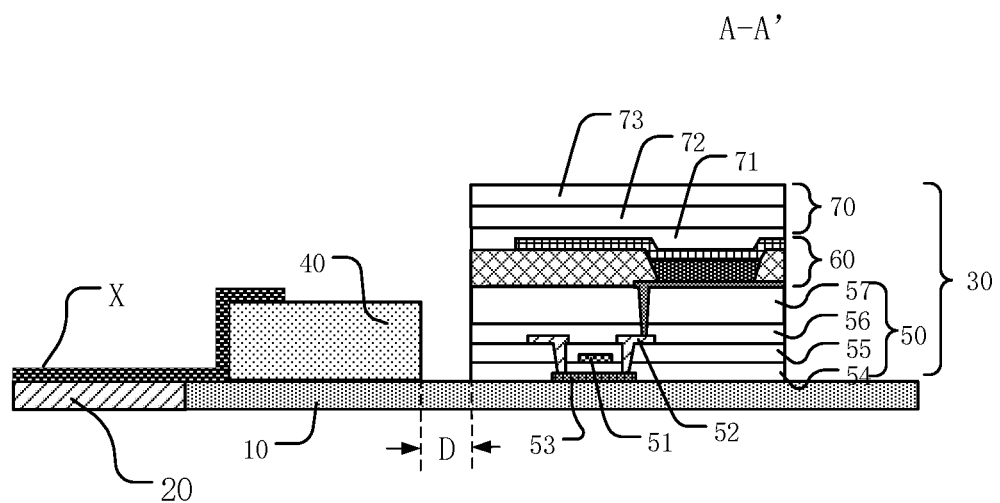
FIG. 6 illustrates another local cross-sectional structural schematic along an AA' direction in FIG. 1.
Figure 7:
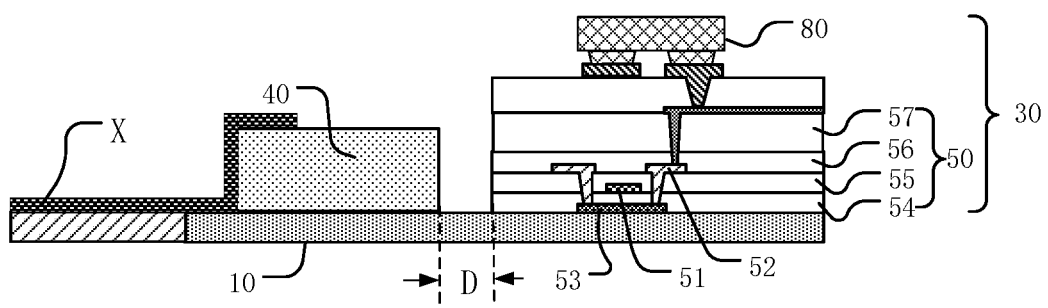
FIG. 7 illustrates another local cross-sectional structural schematic along an AA' direction in FIG. 1.

In an optional embodiment of the present disclosure, FIG. 6 illustrates another local cross-sectional structural schematic along the AA' direction in FIG. 1; and FIG. 7 illustrates another local cross-sectional structural schematic along the AA' direction in FIG. 1. The display function layer 30 may include at least one inorganic layer, and the touch control electrode layer may not be in contact with the at least one inorganic layer in the display function layer 30.

For example, the display function layer 30 including a drive circuit layer 50, a light-emitting layer 60, and an encapsulation layer 70 stacked along the direction perpendicular to the display island 10 may be taken as an example in one embodiment of FIG. 6. Optionally, the drive circuit layer may include a gate metal layer 51, a semiconductor active layer 53, and a source/drain metal layer 52. The gate metal layer 51 and the semiconductor active layer 53 may be separated by a gate insulation layer 54 which may be embodied as an inorganic layer such as silicon nitride, silicon oxide, metal oxide, and/or a combination thereof. The gate metal layer 51 and the source/drain metal layers 52 may be separated by an interlayer insulation layer 55, which may also be embodied as an inorganic layer such as silicon nitride, silicon oxide, and/or a combination thereof. Optionally, a passivation layer 56 may be further disposed on the side of the source/drain metal layer 52 away from the interlayer insulation layer 55, and the passivation layer 56 may be formed of an inorganic layer such as silicon oxide, silicon nitride, or a combination thereof. The light-emitting layer 60 may include a first electrode, a light-emitting material layer, and a second electrode, and further include at least one of a hole injection layer (HIL), a hole transport layer (HTL), an electrode transport layer (ETL), and an electrode injection layer (EIL). If a voltage is applied between the first electrode and the second electrode, the light-emitting material layer may emit visible light to realize the display function. The encapsulation layer 70 may be located on the side of the light-emitting layer 60 away from the drive circuit layer 50, such that the encapsulation layer 70 may protect the light-emitting layer 60 from external moisture and oxygen. The encapsulation layer 70 includes a first inorganic layer 71, an organic layer 72, and a second inorganic layer 73. It may be seen that the gate insulation layer 54, the interlay insulation layer 55, the passivation layer 56 and the like in the display function layer 30 may all be composed of inorganic layers, and the encapsulation layer 70 may also include an inorganic layer.

It may be understood that the film layer structure of the display function layer 130 shown in FIG. 6 may only be exemplary and may not be a limitation on the film layer structure of the display function layer 30 in the present disclosure. In some other embodiments of the present disclosure, the encapsulation layer 70 may also include an inorganic layer covering the side of the light-emitting layer 60 away from the display island 10, which can also encapsulate the light-emitting layer 60 and protect the light-emitting layer 60 from external moisture and oxygen.

It should be noted that, in the present disclosure, when the orthographic projection of the touch control electrode layer on the display island may at least partially surround the orthographic projection of the display function layer on the display island, along the arrangement direction of the touch control electrode layer and the display function layer, the touch control electrode layer 40 may be in contact with the display function layer 30 (e.g., referring to FIG. 3), and a gap may also be included between the touch control electrode layer 40 and the display function layer 30 (e.g., referring to FIG. 6).

The display panel including the drive circuit layer 50 and the light-emitting element 80 stacked on the display island 10 may be taken as an example for description in FIG. 7. The light-emitting element in FIG. 7 may be, for example, an inorganic light-emitting diode. For another example, the light-emitting element 80 may be a micro light-emitting diode, and the size of the micro light-emitting diode may be less than or equal to 100 micrometers. The gate insulation layer 54 and the interlayer insulation layer 55 in the drive circuit layer 50 may be also embodied as inorganic layers such as silicon nitride, silicon oxide, metal oxide, or a combination thereof.

Referring to FIGS. 6-7, in the present disclosure, while the touch control electrode layer 40 is disposed to at least partially surround the display function layer 30, the touch control electrode layer 40 may not be in contact with all inorganic layers in the display function layer 30. When a touch control wire X is electrically connected to the touch control electrode layer 40, the touch control wire X may not be in contact with the inorganic layer in the display function layer 30 and may not climb along the inorganic layers in the display function layer 30. Therefore, while it is beneficial for reducing the crosstalk possibility between a touch control signal and a display signal, it may also reduce the breakage risk of the touch control wire X, thereby being more beneficial for improving the touch control reliability of the stretchable display panel.

In an optional embodiment of the present disclosure, the orthographic projection of the touch control electrode layer 40 on the display island 10 and the orthographic projection of the inorganic layer in the display function layer 30 on the display island 10 may not overlap. Optionally, the inorganic layers in the display function layer 30 mentioned in one embodiment may be all inorganic layers in one embodiment shown in FIG. 6 or FIG. 7.

For example, in order to realize that the touch control electrode layer 40 is not in contact with all inorganic layers in the display function layer 30, the orthographic projection of the touch control electrode layer 40 on the display island 10 and the orthographic projection of the inorganic layer in the display function layer 30 on the display island 10 may be set to not be overlapped with each other in the present disclosure. On a same display island 10, while the touch control electrode layer 40 is disposed on the periphery of the display function layer 30, the orthographic projection of the touch control electrode layer 40 on the display island 10 and the orthographic projection of the display function layer 30 on the display island 10 may not overlap. In such way, when the touch control electrode layer 40 is electrically connected to the touch control wire X, the orthographic projection of the touch control wire X on the display island 10 and the orthographic projection of the inorganic layer in the display function layer 30 on the display island 10 may also not overlap, which may avoid the possibility of the touch control wire X climbing along the inorganic layer in the display function layer 30. Therefore, it is beneficial for reducing the breakage risk of the touch control wire X, thereby improving the touch control reliability of the stretchable display panel.

Figure 8:
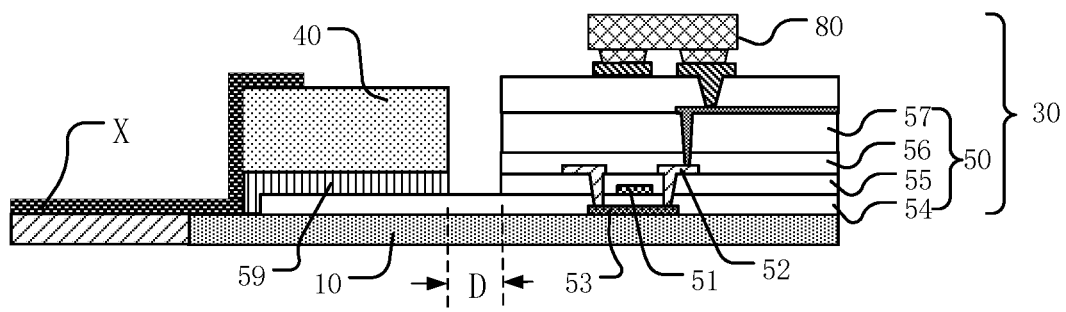
FIG. 8 illustrates another local cross-sectional structural schematic along an AA' direction in FIG. 1.

It should be noted that the embodiment shown in FIGS. 6-7 illustrates that the orthographic projection of the touch control electrode layer 40 on the display island 10 and the orthographic projection of the inorganic layer in the display function layer 30 on the display island 10 may not overlap. In such way, the touch control electrode layer 40 may be effectively separated from the inorganic layer in the display function layer 30. In some optional embodiments of the present disclosure, the orthographic projection of a part of the inorganic layer in the display function layer 30 on the display island 10 may also overlap the orthographic projection of the touch control electrode layer 40. At this point, along the direction perpendicular to the display island 10, the touch control electrode layer 40 may be separated from the inorganic layer by an organic layer. For example, referring to FIG. 8, FIG. 8 illustrates another local cross-sectional structural schematic along the AA' direction in FIG. 1. In one embodiment, the gate insulation layer 54 in the display function layer may extend from the display function layer 30 to the side of the touch control electrode layer 40 adjacent to the display island 10. That is, the orthographic projection of the touch control electrode layer 40 on the display island 10 and the orthographic projection of the gate insulation layer 54 as the inorganic layer on the display island 10 may overlap. At this point, along the direction perpendicular to the display island 10, the touch control electrode layer 40 and the gate insulation layer 54 may be separated by an organic layer 59; and along the direction in parallel with the display island 10, the organic layer 59 may also be disposed between the touch control wire X and the gate insulation layer 54, which avoids the contact between the touch control wire X and the inorganic layer. Such structure may reduce the crosstalk possibility between the touch control signal in the touch control electrode layer 40 and the display signal in the display function layer, and it is also beneficial for reducing the breakage risk of the touch control wire X. In addition, when the part of the inorganic layer is extended to the side of the touch control electrode layer 40 adjacent to the display island 10, the touch control electrode layer 40 may also be elevated, which is beneficial for reducing the distance between a touch object and the touch control electrode layer 40 and also beneficial for improving the touch control sensitivity. It should be noted that, in the embodiment shown in FIG. 8, in addition to the gate insulation layer 54, the touch control electrode layer 40 may be still disposed by surrounding or at least partly surrounding other layers in the display function layer 30. The orthographic projection of the touch control electrode layer 40 on the display island 10 may at least partially surround the orthographic projection of the display function layer 30 on the display island 10 mentioned in the present disclosure, which can be understood as that the orthographic projection of the touch control electrode layer 40 on the display island 10 may at least partially surround the orthographic projection of at least a part of the film layer of the display function layer 30 on the display island 10.

Figure 9:
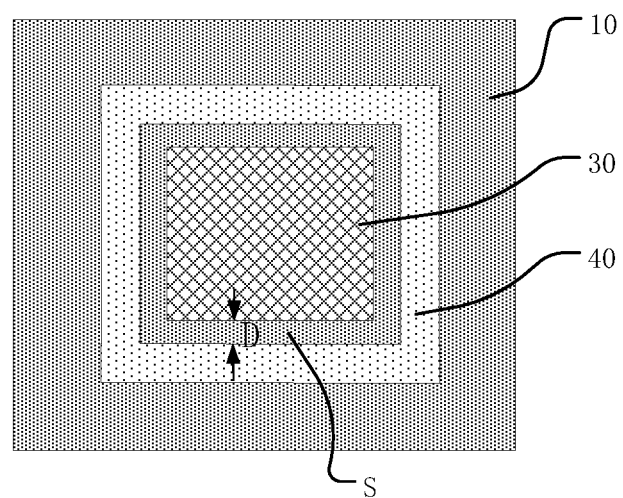
FIG. 9 illustrates another enlarged schematic of a display island in FIG. 1.

In an optional embodiment of the present disclosure, FIG. 9 illustrates another enlarged schematic of the display island 10 in FIG. 1. A first spacing S may be between the orthographic projections of the touch control electrode layer 40 and the display function layer 30 on the display island 10.

For example, referring to FIG. 9, the touch control electrode layer 40 being arranged by surrounding the display function layer 30 on the same display island 10 for one turn may be illustrated in one embodiment. When the touch control electrode layer 40 is disposed by surrounding or partially surrounding the display function layer 30, the first spacing S may be between the orthographic projections of the touch control electrode layer 40 and the display function layer 30 on the display island 10. The touch control electrode layer 40 and the display function layer 30 may be completely isolated by the first spacing S. In the actual manufacturing process, the first spacing S may be formed by removing a part of the film layer between the touch control electrode layer 40 and the display function layer 30, such that the touch control electrode layer 40 and the display function layer 30 may be embodied as two separate parts. When there is a need to electrically connect the touch control wire X to the touch control electrode layer 40, since the touch control electrode layer 40 is located at the periphery of the display function layer 30 and is completely independent of the display function layer 30, on the one hand, the touch control signal of the touch control electrode layer 40 may be effectively isolated from the display signal in the display function layer 30, thereby avoiding crosstalk between the touch control signal and the display signal; on the other hand, the touch control wire X may not be in contact with the display function layer 30, which effectively avoids the wire breakage risk which may be caused by the touch control wire X climbing along the inorganic layer in the display function layer 20, thereby improving the touch control reliability of the stretchable display panel.

In an optional embodiment of the present disclosure, referring to FIG. 9, along the direction from the touch control electrode layer 40 to the display function layer 30, the width of the first spacing S is D, where D≥5 μm.

For example, the width of the first spacing S between the touch control electrode layer 40 and the display function layer 30 is set to be greater than or equal to 5 μm in the present disclosure, which is beneficial for ensuring effective isolation between the touch control electrode layer 40 and the display function layer 30; moreover, the larger the width of the first spacing S is, the better the isolation effect is, which may better avoid the crosstalk between the touch control signal and the display signal, thereby further improving the touch control reliability and display reliability of the stretchable display panel.

Figure 10:
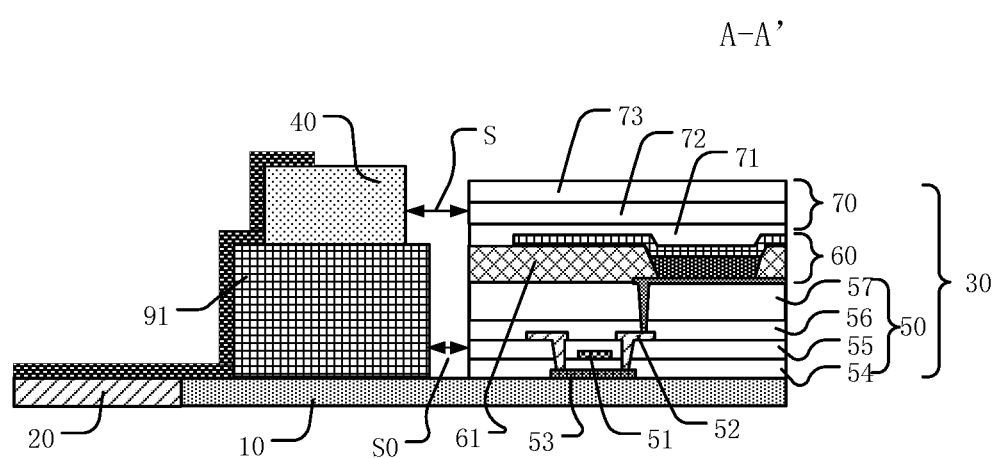
FIG. 10 illustrates another local cross-sectional structural schematic along an AA' direction in FIG. 1.

In an optional embodiment of the present disclosure, FIG. 10 illustrates another local cross-sectional structural schematic along the AA' direction in FIG. 1. The stretchable display panel may further include a first organic padding layer 91 disposed on the display island 10. The orthographic projection of the first organic padding layer 91 on the display island 10 may at least partially surround the orthographic projection of the display function layer 30 on the display island 10. At least a part of the touch control electrode layer 40 may be located on the side of the first organic padding layer 91 away from the display island 10.

For example, referring to FIG. 10, the first organic padding layer 91 may be introduced on the display island 10 in the present disclosure, and at least a part of the touch control electrode may be disposed on the side of the first organic padding layer 91 away from the display island 10. Since the touch control electrode implements touch control detection by sensing its capacitance change, when the distance between a touch object and the touch control electrode is smaller, the capacitance formed between the touch control electrode and the touch body is larger when a touch occurs; the larger the capacitance change on the corresponding touch control electrode is, the more sensitive the touch control is. In the present disclosure, the touch control electrode may be elevated relative to the display island 10 by introducing the first organic padding layer 91, which reduces the distance between the touch control electrode and the touch object. Therefore, it is beneficial for improving the touch control sensitivity of the stretchable display panel, and further beneficial for improving the touch control performance of the stretchable display panel.

Figure 11:
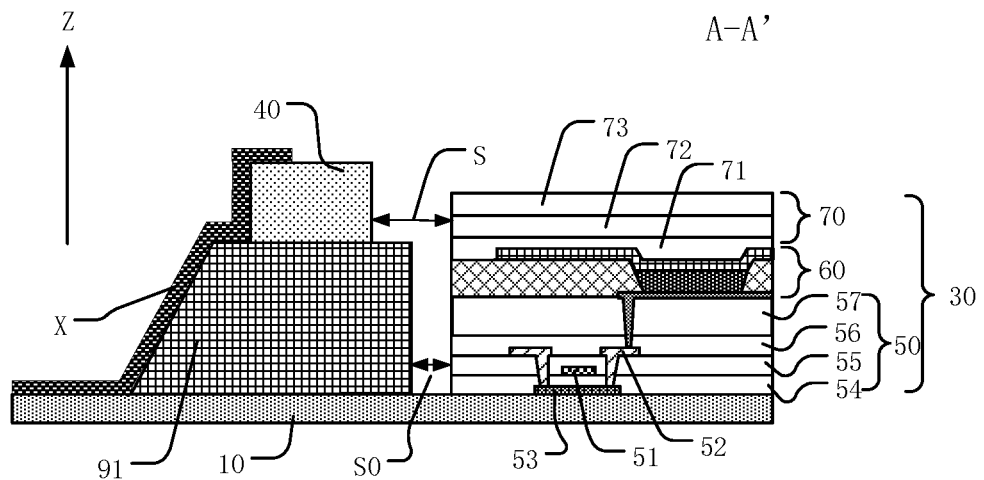
FIG. 11 illustrates another local cross-sectional structural schematic along an AA' direction in FIG. 1.

Moreover, when the first organic padding layer 91 is introduced on the display island 10 and the touch control electrode layer 40 is disposed on the side of the first organic padding layer 91 away from the display island 10, in order to realize the electrical connection between the touch control wire X and the touch control electrode layer 40, the touch control wire X may need to climb on the side surface of the first organic padding layer 91. Since the desirable bonding performance is between the metal wire and the organic material, when the touch control wire X climbs along the side surface of the first organic padding layer 91, a desirable contact may be formed between the touch control wire X and the first organic padding layer 91, which is beneficial for reducing the breakage possibility of the touch control wire X when climbing the side surface and further for improving the display reliability and touch control reliability of the stretchable display panel. It should be noted that, in order to reduce the climbing difficulty of the touch control wire X on the side surface of the first organic padding layer 91, the contact surface between the first organic padding layer 91 and the touch control wire X may be set in the form of a slope in the present disclosure (e.g., referring to FIG. 11) to further reduce the breakage possibility of the touch control wire X. FIG. 11 illustrates another local cross-sectional structural schematic along the AA' direction in FIG. 1. In one embodiment, the angle between the surface of the first organic padding layer 91 contacting the touch control wire X and the plane where the display island 10 is located may be an acute angle. Obviously, in some other embodiments of the present disclosure, the cross-section of the first organic padding layer 91 may also be embodied in an isosceles trapezoid structure, which is beneficial for simplifying the complex formation process of the first organic padding layer 91.

In some optional embodiments of the present disclosure, referring to FIGS. 10-11, the first organic padding layer 91 disposed on the display island 10 may be formed in a same process as any organic layer in the display function film layers. For example, when the display function film layer is embodied as an organic light-emitting structure (e.g., FIG. 11), a planarization layer 57 may also be disposed on the side of the passivation layer 56 away from the source/drain metal layer 52. The planarization layer may be embodied as an organic layer including acrylic, polyimide (PI), benzocyclobutene (BCB), and/or any combination thereof. When forming the planarization layer 57, the first organic padding layer 91 may be formed on the display island 10 simultaneously, such that there is no need to introduce a separate new formation process for the production of the organic padding layer. Therefore, it is beneficial for simplifying the formation process of the first organic padding layer 91 in the stretchable display panel and improving the manufacturing efficiency of the stretchable display panel.

Figure 12:
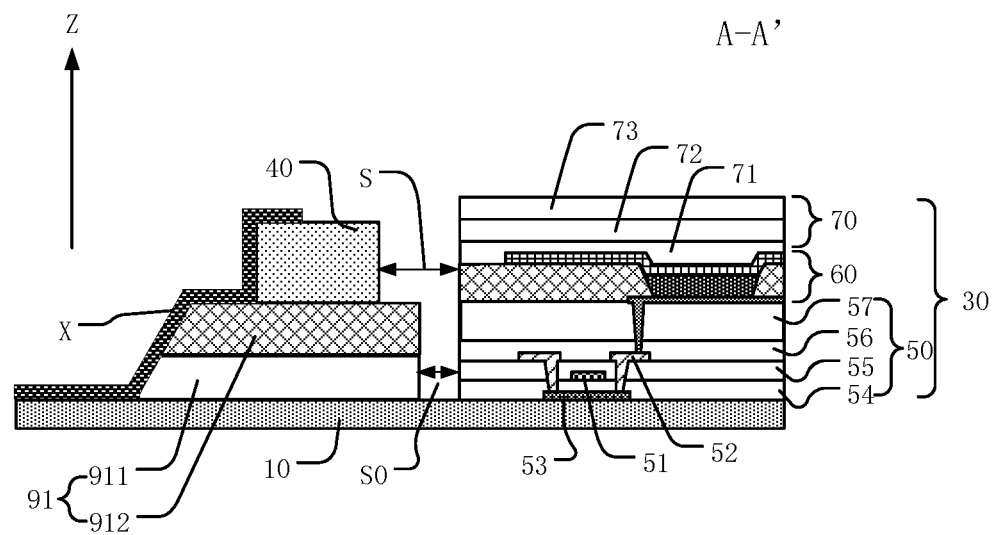
FIG. 12 illustrates another local cross-sectional structural schematic along an AA' direction in FIG. 1.

It may be understood that, in order to increase the height of the first organic padding layer 91, the first organic padding layer 91 in the present disclosure may be formed in a same layer as two organic layers in the display function layer, respectively. For example, FIG. 12 illustrates another local cross-sectional structural schematic along the AA' direction in FIG. 1. The light-emitting layer 60 may include a pixel defining layer 61, which may be made of an organic material including polyimide, polyamide, benzocyclobutene, acrylic resin, phenolic resin, and/or any other suitable material(s); and the planarization layer 57 may also be made of an organic material including polyimide, polyamide, benzocyclobutene, acrylic resin, phenolic resin, and/or any other suitable material(s). The first organic padding layer 91 may include two parts, a padding layer 911 and a padding layer 912, respectively. The padding layer 911 may be formed simultaneously when forming the planarization layer 57; the padding layer 912 may be formed simultaneously when forming the pixel defining layer 61. In such way, on the one hand, there is no need to introduce a new formation process for the formation of the first organic padding layer 91, and the formation process of the organic layer in the display function layer 30 may be multiplexed as the formation process of the first organic padding layer 91, which is beneficial for simplifying the formation process of the stretchable display panel and improving production effectiveness; on the other hand, the first organic padding layer 91 and two organic layers in the display function layer 30 are disposed in a same layer, which is also beneficial for increasing the height of the first organic padding layer 91 and reducing the difference between the touch control electrode layer 40 and the touch object to improve touch control sensitivity.

Figure 13:
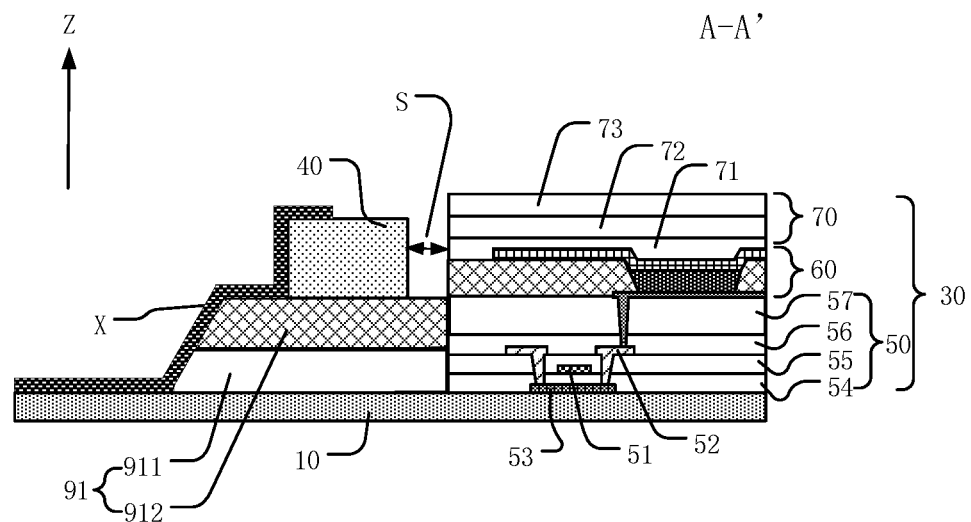
FIG. 13 illustrates another local cross-sectional structural schematic along an AA' direction in FIG. 1.

It should be noted that FIGS. 10-12 only illustrate that a second spacing S0 is included between the first organic padding layer 91 and the display function layer 30. In some other embodiments of the present disclosure, the first organic padding layer 91 may also directly contact the side surface of the display function layer 30. For example, referring to FIG. 13, FIG. 13 illustrates another local cross-sectional structural schematic along the AA' direction in FIG. 1. Such arrangement may be beneficial for saving the etching process of the organic layer, effectively isolating the touch control signal from the display signal, and effectively reducing the crosstalk possibility between the touch control signal in the touch control electrode layer and the display signal in the display function layer.

Figure 14:
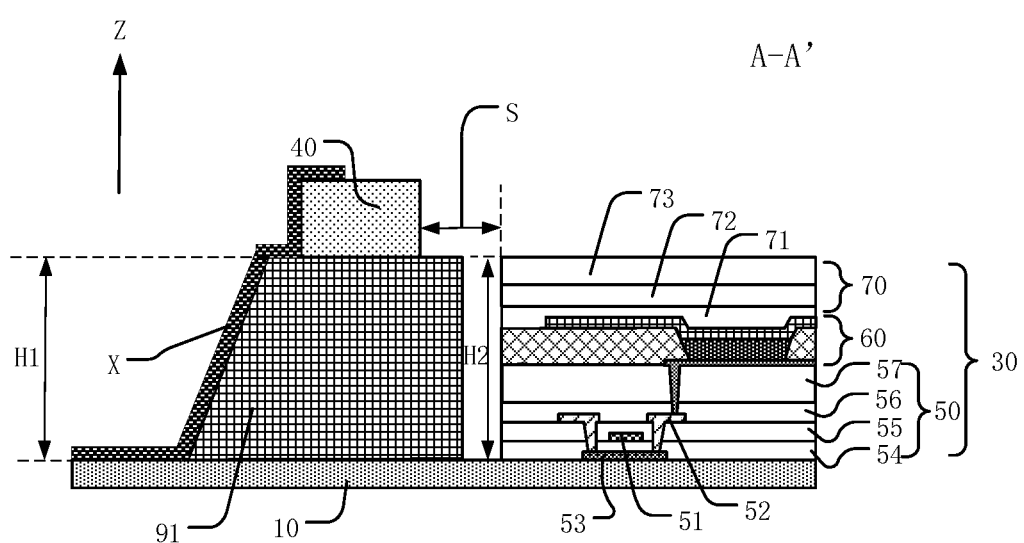
FIG. 14 illustrates another local cross-sectional structural schematic along an AA' direction in FIG. 1.

In an alternative embodiment of the present disclosure, FIG. 14 illustrates another local cross-sectional structural schematic along the AA' direction in FIG. 1. Along the direction perpendicular to the display island 10, the height H1 of the first organic padding layer 91 may be greater than or equal to the height H2 of the display function layer 30.

For example, FIG. 14 illustrates a situation that, along a direction Z perpendicular to the display island 10, the height H1 of the first organic padding layer 91 is equal to the height H2 of the display function layer 30. When the stretchable display panel is formed into a display device, a cover plate may be disposed on the side of the light-exiting surface of the stretchable display panel. The light-exiting surface herein may on the side of the touch control electrode layer 40 away from the display island 10 and may be in parallel with the plane where the cover plate is located. When users touch the stretchable display panel, they usually touch the cover plate. When the height H1 of the first organic cushion layer 91 is equal to the height H2 of the display function layer 30, it is equivalent to further elevating the touch control electrode layer 40 to make the touch control electrode closer to the touch object, which is beneficial for increasing the coupling capacitance between the touch object and the touch control electrode, such that it is more beneficial for improving the touch control sensitivity of the stretchable display panel. In some other embodiments of the present disclosure, in order to further reduce the distance between the touch control electrode layer 40 and the touch object, along the direction perpendicular to the display island 10, the height H1 of the first organic padding layer 91 may be set to be greater than the height H2 of the display function layer 30, which is beneficial for further improving the touch control sensitivity of the stretchable display panel.

Figure 15:
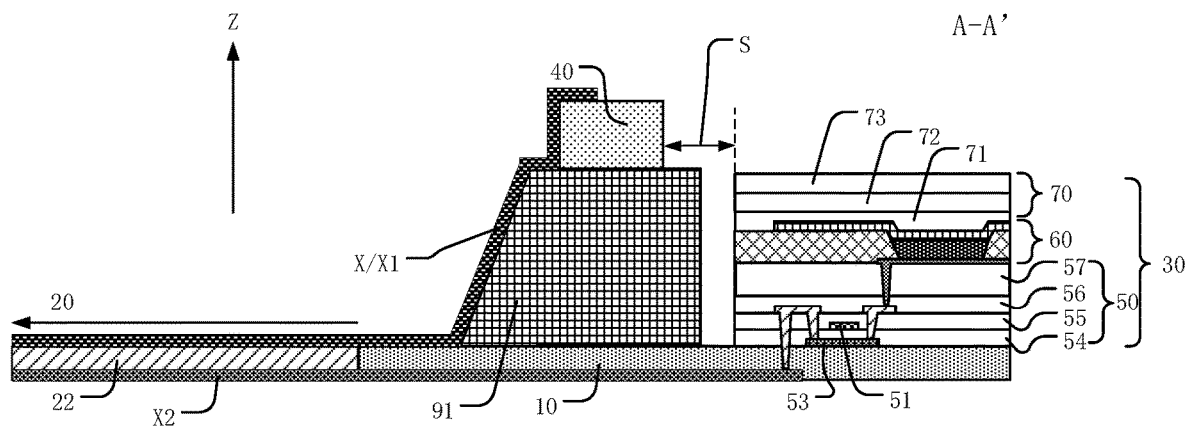
FIG. 15 illustrates a schematic of a connection between a touch control electrode layer/a display function layer and peripheral wires according to various embodiments of the present disclosure.

In an optional embodiment of the present disclosure, FIG. 15 illustrates a schematic of a connection between the touch control electrode layer 40/the display function layer 30 and peripheral wires according to various embodiments of the present disclosure. It should be noted that FIG. 15 may only illustrate the touch control electrode layer 40 and the display function layer 30 and may not represent the actual film structure of the touch control electrode layer 40 and the display function layer 30. In one embodiment, the stretchable display panel may further include a first signal line X1 electrically connected to the touch control electrode layer 40. At least a part of the first signal line X1 may extend from the stretch bridge 20 to the display island 10, and at least extend to the sidewall of the first organic padding layer 91.

It may be understood that the first signal line X1 mentioned in one embodiment may be equivalent to the touch control wire X mentioned above; for a same first signal line X1, a part of the first signal line X1 may be located on the stretch bridge 20, and the other part of the first signal line X1 may be located on the display island 10. That is, the first signal line X1 may extend from the stretch bridge 20 to the display island 10. The first signal line X1 on the display island 10 may also extend to the sidewall of the first organic padding layer 91, and extend along the sidewall of the first organic padding layer 91 to the side of the first organic padding layer 91 away from the display island 10, thereby implementing the electrical connection with the touch control electrode layer 40. In the present disclosure, the first organic padding layer 91 may be disposed on the display island 10, and the film layer in contact with the first signal line X1 may be an organic layer. In such way, the first signal line X1 may reliably contact the organic film layer to effectively reduce the breakage risk of the first signal line X1, which is advantageous for improving the transmission reliability of the first signal line X1 to touch control signals and further improving the touch control reliability of the stretchable display panel.

In an optional embodiment of the present disclosure, referring to FIG. 15, the stretchable display panel may further include a second signal line X2 electrically connected to the display function layer 30. At least a part of the second signal line X2 may extend from the stretch bridge 20 to the display island 10, and at least a part of the second signal line X2 on the display island 10 may be at the side of the first organic padding layer 91 adjacent to the display island 10.

For example, referring to FIG. 15, the second signal line X2 mentioned in one embodiment may be a display signal line, that is, the wire configured to provide signals to the display function layer 30, which may be, for example, embodied as a gate line, a data line, a fixed-level signal line, and the like, which may not be limited according to the embodiments of the present disclosure. For a same second signal line X2, a part of the second signal line X2 may be located on the stretch bridge 20, and the other part of the second signal line X2 may be located on the display island 10. That is, the second signal line X2 may extend from the stretch bridge 20 to the display island 10; and the second signal line X2 located on the display island 10 may extend from the side of the first organic padding layer 91 adjacent to the display island 10 to a position corresponding to the display function layer 30, thereby implementing the electrical connection with the display function layer 30. The second signal line X2 may be wired from the location below the first organic padding layer 91 (e.g., the side adjacent to the display island 10). On the one hand, it may avoid that the second signal line X2 is wired on the first organic padding layer 91, thereby simplifying the wiring process of the second signal line X2; on the other hand, it may also be beneficial for increasing the distance between the first signal line X1 and the second signal line X2 on the display island 10, and further beneficial for reducing the crosstalk possibility between the signals transmitted by the first signal line X1 and the second signal line X2, thereby being beneficial for improving the display reliability and touch control reliability of the stretchable display panel.

In an alternative embodiment of the present disclosure, referring to FIG. 15, at least a part of the stretch bridge 20 may be disposed with both the first signal line X1 and the second signal line X2; and the first signal line X1 and the second signal line X2 may be disposed at different layers.

For example, at least a part of the first signal lines X1 electrically connected to the touch control electrode layer 40 and at least a part of the second signal lines X2 electrically connected to the display function layer 30 may both extend from the stretch bridge 20 to the display island 10. Therefore, both the first signal line X1 and the second signal line X2 may be disposed on the stretch bridge 20. When both the first signal line X1 and the second signal line X2 are disposed on a same stretch bridge 20, the first signal line X1 and the second signal line X2 may be disposed at different layers, which is beneficial for increasing the distance between the first signal line X1 and the second signal line X2 along the direction perpendicular to the extending direction of the stretch bridge 20. When the distance increases, the coupling capacitance between the first signal line X1 and the second signal line X2 decreases. Therefore, such arrangement of the first signal line X1 and the second signal line X2 may be beneficial for further reducing the crosstalk phenomenon between the touch control signal transmitted by the first signal line X1 and the display signal transmitted by the second signal line X2; and such arrangement may also be beneficial for reliable transmission of the touch control signal and the display signal in the stretchable display panel, and further be beneficial for improving the touch control reliability and display reliability of the stretchable display panel.

In an alternative embodiment of the present disclosure, referring to FIG. 15, along the direction perpendicular to the extending direction of the stretch bridge 20, the first signal line X1 and the second signal line X2 may be separated by an organic insulation layer 22.

For example, when both the first signal line X1 and the second signal line X2 are disposed on a same stretch bridge 20, along the direction perpendicular to the extending direction of the stretch bridge 20, the organic insulation layer 22 may be disposed between the first signal line X1 and the second signal line X2. The elastic modulus of the organic insulation layer 22 may be relatively small, and the organic insulation layer 22 may have desirable stretchability. When the stretch bridge 20 is stretched, the organic insulation layer 22 may have desirable stretching deformation with the stretching force. Therefore, the insulation layer between the first signal line X1 and the second signal line X2 is configured as the organic insulation layer 22, which is beneficial for improving the stretching performance of the stretchable display panel.

It should be noted that FIG. 15 only illustrates that the first signal line X1 and the second signal line X2 are disposed at different layers. At this point, the second signal line X2 may be disposed at the side of the display island 10 away from the display function layer 30. In some embodiments of the present disclosure, the second signal line X2 may also be disposed at the side of the display island 10 adjacent to the display function layer 30, for example, at a same layer as the first signal line X1. At this point, the second signal line X2 may be disposed at a same layer as certain metal film layers in the display function layer 30, for example, may be disposed at the same layer as the source/drain of the thin film transistor in the display function layer 30. In such way, the formation of the second signal line X2 may be completed simultaneously when the source/drain electrode is formed, which is beneficial for simplifying the manufacturing process of the stretchable display panel and improving the manufacturing efficiency of the stretchable display panel.

Figure 16:
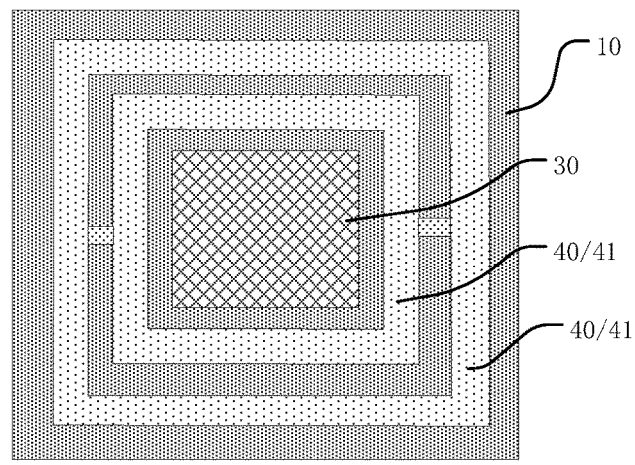
FIG. 16 illustrates another enlarged schematic of a display island in FIG. 1.
Figure 17:
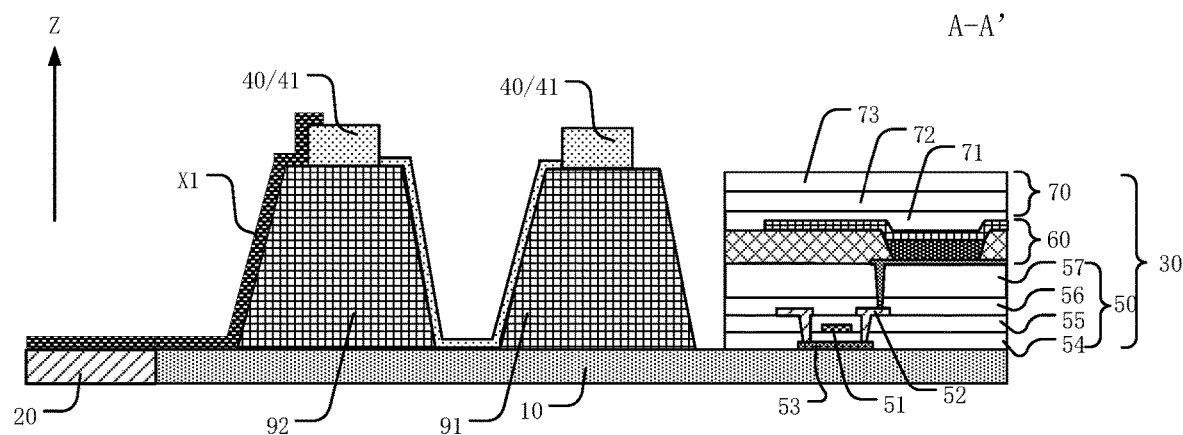
FIG. 17 illustrates another local cross-sectional structural schematic along an AA' direction in FIG. 1.

In an alternative embodiment of the present disclosure, FIG. 16 illustrates another enlarged schematic of the display island 10 in FIG. 1; and FIG. 17 illustrates another local cross-sectional structural schematic along the AA' direction in FIG. 1. It should be noted that FIG. 17 in one embodiment may only exemplarily illustrate a cross-sectional schematic of a portion of the film layer of the display island 10 and the stretch bridge 20, which may not limit the cross-sectional structure of the stretchable display panel. The stretchable display panel may further include at least one second organic padding layer 92 disposed on the display island 10. The orthographic projection of the second organic padding layer 92 on the display island 10 may at least partially surround the orthographic projection of the display function layer 30 on the display island 10. The second organic padding layer 92 may be located at the side of the first organic padding layer 91 away from the display function layer 30. At least a part of the touch control electrode layer 40 may be located at the side of the second organic padding layer 92 away from the display island 10.

For example, FIGS. 16-17 illustrate a situation that two organic padding layers are disposed on a same display island 10, and two organic padding layers are the first organic padding layer 91 and the second organic padding layer 92 respectively. The orthographic projections of the first organic padding layer 91 and the second organic padding layer 92 on the display island 10 may both be disposed by at least partially surrounding the display function layer 30. FIG. 16 illustrates a situation that the orthographic projections of the first organic padding layer 91 and the second organic padding layer 92 on the display island 10 may surround the display function layer 30. In some other embodiments of the present disclosure, the first organic padding layer 91 may also partially surround the display function layer 30, and the second organic padding layer 92 may also completely surround the display function layer 30, which may not be limited according to the embodiments of the present disclosure. The surrounding manner of the display function layer 30 by the first organic padding layer 91 and the second organic padding layer 92 may be flexibly set according to actual needs. In the embodiment shown in FIGS. 16-17, the second organic padding layer 92 may be disposed on the periphery of the first organic padding layer 91, such that at least a part of the first organic padding layer 91 is located between the second organic padding layer 92 and the display function layer 30. In the present disclosure, two or more organic padding layers may be disposed on the same display island 10, and the touch control electrode layer 40 may be disposed on the side of each organic padding layer away from the display island 10, which is equivalent to increasing the area of the orthographic projection of the touch control electrode layer 40 on the display island 10, thereby increasing the area occupied by the touch control electrode layer 40 in the entire stretchable display panel. When the touch body touches the stretchable display panel, as the area of the touch control electrode layer 40 increases, the coverage area of the touch control electrode layer 40 on the stretchable display panel may increase, such that more areas may sense the touch control, which is beneficial for increasing the touch control sensing area of the stretchable display panel, and further beneficial for improving the touch control accuracy of the stretchable display panel.

In an alternative embodiment of the present disclosure, referring to FIGS. 16-17, the touch control electrode layer 40 may include touch control electrodes 41. At a same display island 10, the touch control electrode 41 located on the side of the first organic padding layer 91 away from the display island 10 and the touch control electrode 41 located on the side of the second organic padding layer 92 away from the display island 10 may be electrically connected with each other.

For example, when two or more organic padding layers are disposed on the same display island 10, the touch control electrode layer 40 may be disposed at the side of the multiple organic padding layers away from the display island 10. The touch control electrode 41 located on the side of the first organic padding layer 91 away from the display island 10 and the touch control electrode 41 located on the side of the second organic padding layer 92 away from the display island 10 may be electrically connected with each other in the present disclosure, such that the touch control electrodes 41 on different organic padding layers may be equipotential. It is equivalent to increasing the orthographic projection area of the same touch control electrode on the display island 10. When the touch control subject touches the stretchable display panel, more areas on the display island 10 may be able to sense the touch control of the touch control subject, which is beneficial for improving the touch control accuracy of the stretchable display panel.

It should be noted that the touch control electrodes in the touch control electrode layer of the present disclosure may be touch control electrodes in the form of self-capacitance or mutual capacitance, which may not be limited according to the embodiments of the present disclosure.

In an alternative embodiment of the present disclosure, referring to FIG. 17, along the direction Z perpendicular to the display island 10, the height of the first organic padding layer 91 may be same as the height of the second organic padding layer 92.

For example, when both the first organic padding layer 91 and the second organic padding layer 92 are disposed on a same display island 10, the height of the first organic padding layer 91 may be configured as same as the height of the second organic padding layer 92 along the direction Z perpendicular to the display island 10 in the present disclosure. In such way, the plane of the touch control electrode 41 located on the side of the first organic padding layer 91 away from the base substrate and the plane of the touch control electrode 41 located on the side of the second organic padding layer 92 away from the base substrate may be on a same plane. When the touch object touches the stretchable display panel, the vertical distance between the touch control electrode 41, located on the side of the first organic padding layer 91 away from the base substrate, and the touch object may be equal to the vertical distance between the touch control electrode 41, located on the side of the second organic padding layer 92 away from the base substrate, and the touch body. Because the touch control electrodes on different organic padding layers are equipotential, equivalently, they are considered as belonging to a same touch control electrode. Therefore, the above-mentioned design may be beneficial for ensuring that, when the same touch control electrode 41 senses the touch of the touch object, the capacitance changes sensed at different positions of the same touch control electrode 41 may be same, thereby being beneficial for improving the touch control uniformity of the same touch control electrode at different positions, and further for improving the touch control effect of the stretchable display panel.

Figure 18:
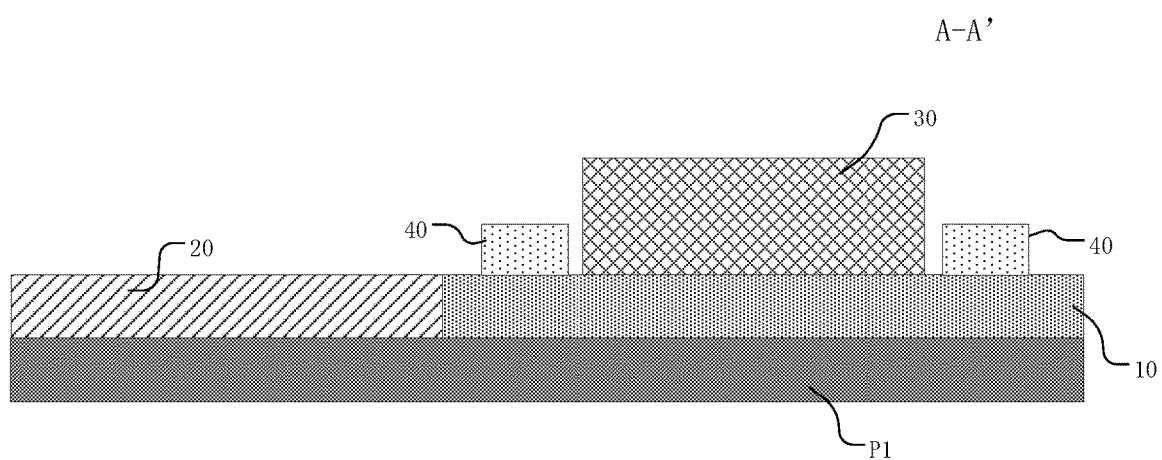
FIG. 18 illustrates another local cross-sectional structural schematic along an AA' direction in FIG. 1.

In an optional embodiment of the present disclosure, FIG. 18 illustrates another local cross-sectional structural schematic along the AA' direction in FIG. 1. It should be noted that FIG. 18 in one embodiment may only exemplarily illustrate a cross-sectional schematic of a portion of the film layer of the display island 10 and the stretch bridge 20, which may not limit the cross-sectional structure of the stretchable display panel. The stretchable display panel may further include a first substrate P1; and the display island 10 and the stretch bridge 20 may both be formed on the first substrate P1.

For example, when both the display island 10 and the stretch bridge 20 are formed on the same first substrate P1 in the present disclosure, the display island 10 and the stretch bridge 20 may be formed on the same first substrate P1, and there is no need to provide different substrates for the display island 10 and the stretch bridge 20, respectively. In such way, it is beneficial for simplifying the manufacturing process of the stretchable display panel and improving the manufacturing efficiency of the stretchable display panel. Meanwhile, when the display island 10 and the stretch bridge 20 are disposed on the same first substrate P1, the entire panel structure may be more stable. It may be understood that the elastic modulus of the stretch bridge 20 may be less than the elastic modulus of the display island 10, and the stretch bridge 20 may be used to realize the stretching function of the stretchable display panel. When the stretched bridge 20 is stretched, the display island 10 may not be deformed.

Figure 19:
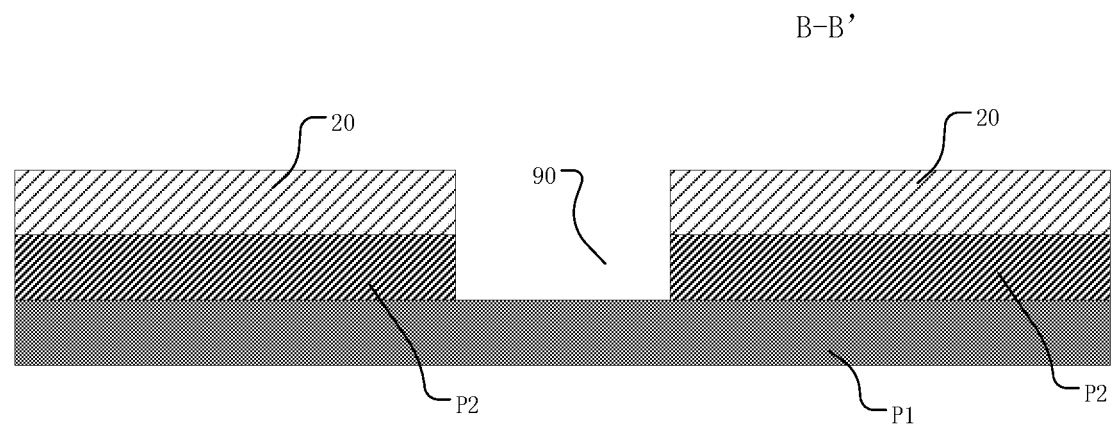
FIG. 19 illustrates another local cross-sectional structural schematic along an BB' direction in FIG. 1.
Figure 20:
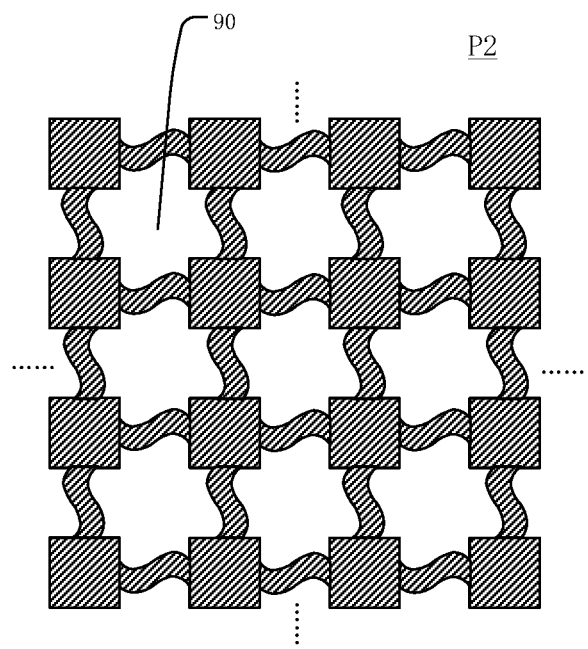
FIG. 20 illustrates a planar structural schematic of a second substrate in FIG. 19.

In an optional embodiment of the present disclosure, FIG. 19 illustrates another local cross-sectional structural schematic along an BB' direction in FIG. 1. It should be noted that FIG. 19 in one embodiment may only exemplarily illustrate a cross-sectional schematic of a portion of the film layer of the display island 10 and the stretch bridge 20, which may not limit the cross-sectional structure of the stretchable display panel. FIG. 20 illustrates a planar structural schematic of a second substrate P2 in FIG. 19. The stretchable display panel provided by the present disclosure may further include the second substrate P2 disposed between the first substrate P1 and the display island 10. The first substrate P1 may be a whole-surface deposited structure, and the second substrate P2 may be disposed with multiple hollowed structures 90. The orthographic projections of the display island 10 and the stretch bridge 20 on the first substrate P1 may be located within the orthographic projection of the second substrate P2 on the first substrate P1.

For example, the embodiment shown in FIGS. 19-20 illustrates a situation that the stretchable display panel includes two substrates. The first substrate P1 of the stretchable display panel may be a whole-surface deposited structure, used as a carrier for other film structures of the stretchable display panel to make the entire panel structure more stable. Optionally, the material of the first substrate P1 may have a relatively large deformability, which may achieve the stretching performance of the stretchable display panel. However, the second substrate P2 disposed between the first substrate P1 and the display island 10 may be not a whole-surface deposited structure and may include a plurality of hollowed structures 90. The position corresponding to the hollowed structures 90 may not be disposed with the display island 10 and the stretch bridge 20, that is, the second substrate P2 may be a patterned structure. Each independent display island 10 and the stretch bridges 20 connecting to the display islands 10 may be formed on the regions outside the hollowed structures 90. Since each film layer of the panel needs to withstand relatively high temperature during the manufacturing process, the second substrate P2 may be relatively thin, and the manufacturing material thereof may have poor stretchability. In one embodiment, the second substrate P2 may be disposed with hollowed structures 90, and then the stretching performance of the second substrate P2 may be improved by patterning the second substrate P2.

Optionally, the material of the first substrate P1 mentioned in the embodiment of the present disclosure may be, but not be limited to, polydimethylsiloxane (PDMS), and the material of the second substrate P2 may be, but not be limited to, polyimide (PI), which may be set during implementation according to actual needs.

Figure 21:
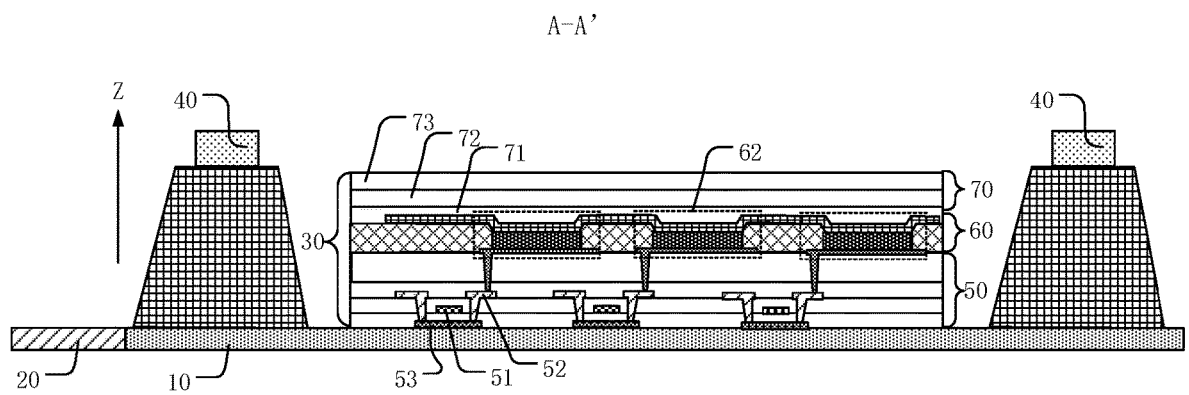
FIG. 21 illustrates another local cross-sectional structural schematic along an AA' direction in FIG. 1.
Figure 22:
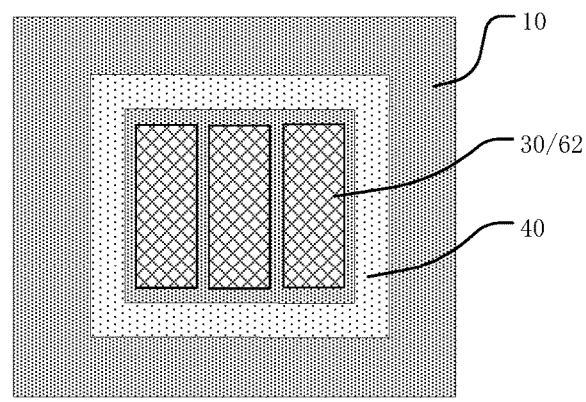
FIG. 22 illustrates another enlarged schematic of a display island in FIG. 1.

In an alternative embodiment of the present disclosure, referring to FIG. 21, FIG. 21 illustrates another local cross-sectional structural schematic along the AA' direction in FIG. 1; and FIG. 22 illustrates another enlarged schematic of the display island 10 in FIG. 1. The display function layer 30 may include the drive circuit layer 50, the light-emitting layer 60, and the encapsulation layer 70. Along the direction perpendicular to the display island 10, the light-emitting layer 60 may be located between the drive circuit layer 50 and the encapsulation layer 70; and the encapsulation layer 70 may be located on the side of the light-emitting layer 60 away from the display island 10. At least one of the drive circuit layer 50 and the encapsulation layer 70 may include at least one inorganic layer.

In the previous embodiment corresponding to FIG. 6, one sub-pixel may be disposed on the same display island 10, and the sub-pixel may be correspondingly embodied as an organic light-emitting structure. The film structure of the display function layer 30 in the embodiment shown in FIG. 21 may be same as the film structure in the embodiment shown in FIG. 6, and both film structures may correspond to organic light-emitting structures. The difference is that three sub-pixels, that is, three corresponding light-emitting elements 62, may be disposed on the same display island 10 in the embodiment shown in FIG. 21. Referring to FIG. 22, the three sub-pixels may be red, green, and blue sub-pixels, and may be set as a whole pixel unit; and the touch control electrode layer 40 may be disposed by surrounding the three sub-pixels. The gate insulation layer 54, the interlayer insulation layer 55, and the passivation layer 56 in the drive circuit layer 50 may be made of inorganic layers, and the encapsulation layer 70 may also include two inorganic layers. When the above-mentioned organic light-emitting structures are disposed on the display island 10, the inorganic layers mentioned in the embodiment of the present disclosure may include each inorganic layer in the above-mentioned drive circuit layer 50 and the encapsulation layer 70. In the present disclosure, the touch control electrode layer 40 may not be in contact with the inorganic layer in the display function layer 30. When the touch control wire X is electrically connected to the touch control electrode layer 40, the touch control wire X may not be in contact with the inorganic layer in the display function layer 30 and may not climb along the inorganic layer in the display function layer 30. Therefore, while it is beneficial for reducing the crosstalk possibility between the touch control signal and the display signal, it may also reduce the breakage risk of the touch control wire X, thereby being more beneficial for improving the touch control reliability of the stretchable display panel. It should be noted that the light-emitting colors of the three light-emitting elements 62 located on the same display island 10 may be different. For example, the light-emitting colors may be red, green, and blue, respectively, thereby implementing the color display function of the stretchable display panel.

Figure 23:
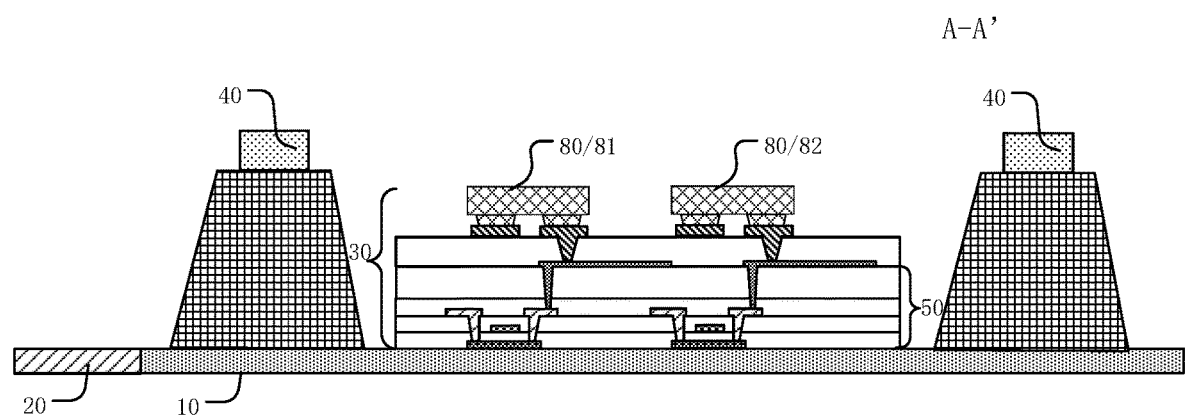
FIG. 23 illustrates another local cross-sectional structural schematic along an AA' direction in FIG. 1.
Figure 24:
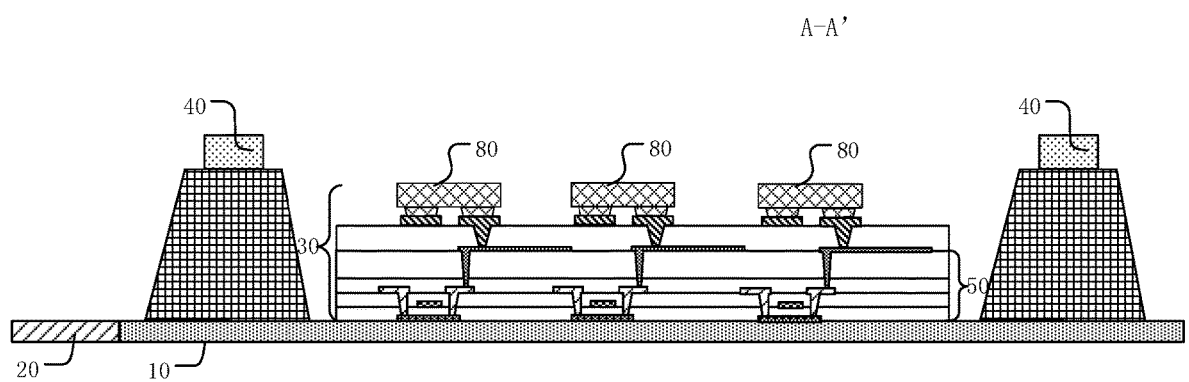
FIG. 24 illustrates another local cross-sectional structural schematic along an AA' direction in FIG. 1.

In an optional embodiment of the present disclosure, FIG. 23 illustrates another local cross-sectional structural schematic along the AA' direction in FIG. 1; and FIG. 24 illustrates another local cross-sectional structural schematic along the AA' direction in FIG. 1. The display function layer 30 may include the drive circuit layer 50 and light-emitting element 80 located on the side of the drive circuit layer 50 away from the display island 10; and the light-emitting element 80 may be at least one of a Micro light-emitting diode (LED) and a Mini LED. At least one of the drive circuit layer 50 and the light-emitting element 80 may include at least one inorganic layer.

The previous embodiment corresponding to FIG. 7 illustrates that the display function layer 30 may be an inorganic light-emitting display structure, and one light-emitting element 80 may be disposed on the same display island 10. In some other embodiments of the present disclosure, two light-emitting elements 80 may be further disposed on the same display island 10 (e.g., referring to FIG. 23). In the embodiment shown in FIG. 23, two light-emitting elements 80, which are a first light-emitting element 81 and a second light-emitting element 82 respectively, may be disposed on the same display island 10. Optionally, under normal circumstances, the first light-emitting element 81 may emit light, and the second light-emitting element 82 may serve as a backup light-emitting element 80. When the first light-emitting element 81 fails to emit light normally, the second light-emitting element 82 may be controlled to emit light, thereby implementing the repair of the light-emitting element 80 on the same display island 10. Obviously, in some other embodiments of the present disclosure, the number of light-emitting elements 80 included on the same display island 10 may also be three. For example, referring to FIG. 24, the light-emitting colors of the 3 light-emitting elements 80 may all be different. For example, the light-emitting colors of the 3 light-emitting elements 80 may be red, green, and blue, respectively, thereby implementing the color display function of the stretchable display panel.

Figure 25:
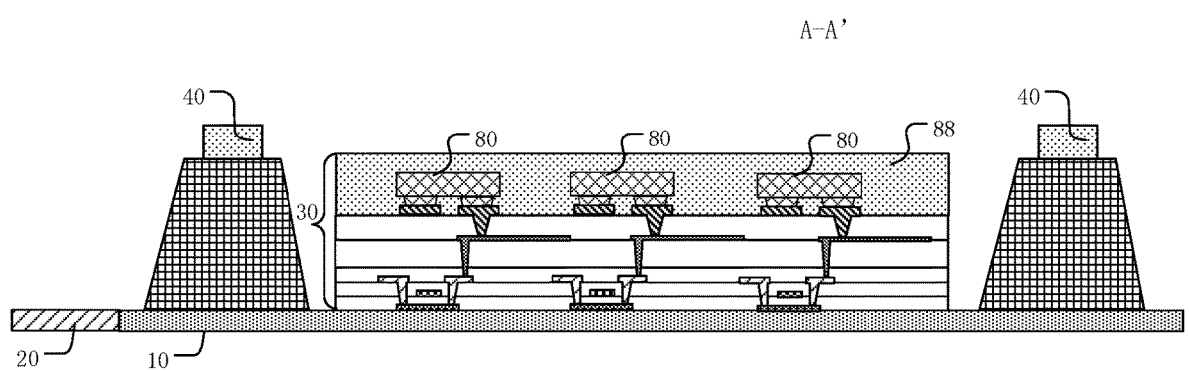
FIG. 25 illustrates another local cross-sectional structural schematic along an AA' direction in FIG. 1.

It should be noted that, when the display function layer 30 of the stretchable display panel corresponds to the inorganic light-emitting display structure shown in FIG. 23 or FIG. 24, the gate insulation layer, the interlayer insulation layer, and the passivation layer in the drive circuit layer may be made of inorganic layers. In order to avoid external moisture and oxygen from affecting the light-emitting performance of the light-emitting element 80, at least one encapsulation layer 88 may be disposed around the light-emitting element 80 (e.g., referring to FIG. 25). Optionally, the encapsulation layer 88 may be embodied as an inorganic layer, which may have a desirable function of isolating moisture and oxygen, thereby being beneficial for improving the light-emitting reliability of the light-emitting element 80. FIG. 25 illustrates another local cross-sectional structural schematic along the AA' direction in FIG. 1. When the above-mentioned inorganic light-emitting structures are disposed on the display island 10, the inorganic layers mentioned in the embodiments of the present disclosure may include each of the above-mentioned drive circuit layer 50 and the encapsulation layer 70. In the present disclosure, the touch control electrode layer 40 may not be in contact with the inorganic layer in the display function layer 30. When the touch control wire X is electrically connected to the touch control electrode layer 40, the touch control wire X may not be in contact with the inorganic layer in the display function layer 30 and may not climb along the inorganic layer in the display function layer 30. Therefore, while it is beneficial for reducing the crosstalk possibility between the touch control signal and the display signal, it may also reduce the breakage risk of the touch control wire X, thereby being more beneficial for improving the touch control reliability of the stretchable display panel.

Figure 26:
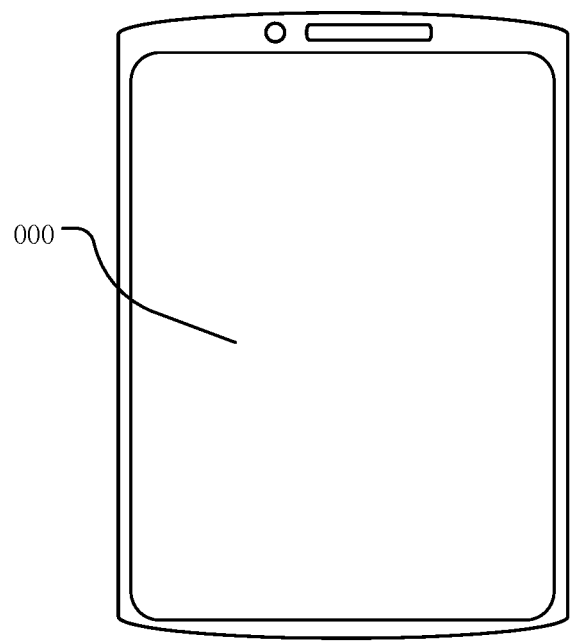
FIG. 26 illustrates a planar structural schematic of a display device according to various embodiments of the present disclosure.

Based on the same inventive concept, the present disclosure also provides a display device 111. FIG. 26 illustrates a planar structural schematic of the display device 111 according to various embodiments of the present disclosure. The display device 111 provided in one embodiment may include the stretchable display panel 000 provided in the above-mentioned embodiments of the present disclosure. A mobile phone may be taken as an example to illustrate the display device 111 in one embodiment shown in FIG. 26. It can be understood that the display device provided by the embodiments of the present disclosure may be a computer, a television, a vehicle-mounted display device, and other display devices with a display function, which may not be limited according to the embodiments of the present disclosure. The display device provided by the embodiments of the present disclosure may have the beneficial effects of the stretchable display panel provided by the embodiments of the present disclosure. Details may refer to the description of the stretchable display panel in the above-mentioned embodiments, which may not be described in detail herein.

From the above-mentioned embodiments, it can be seen that the stretchable display panel and the display device provided by the present disclosure may achieve at least the following beneficial effects.

The stretchable display panel and display device provided in the present disclosure may include display islands arranged in an array and the stretch bridge for connecting to two adjacent display islands, and further include the display function layer and the touch control electrode layer which are both disposed on the display island, where the orthographic projection of the touch control electrode layer on the display island may at least partially surround the orthographic projection of the display function layer on the display island. The setting manner of the display islands and the stretch bridges may enable the display panel to have stretchability. Particularly, in the present disclosure, both the display function layer and the touch control electrode layer may be disposed on the display island, and the touch control electrode layer may be disposed by at least partially surrounding the display function layer. While satisfying the stretching property, such setting manner may be beneficial for avoiding the crosstalk between the touch control signal and the display signal, thereby improving the display reliability and touch control reliability; and there is no need to separately provide the island structure for the touch control electrode layer, which is further beneficial for simplifying the manufacturing process and improving the production efficiency.

Although certain embodiments of the present disclosure have been described in detail through examples, those skilled in the art should understand that the above-mentioned examples are merely for illustration and not for limiting the scope of the present disclosure. Those skilled in the art should understand that the above-mentioned embodiments may be modified without departing from the scope and spirit of the present disclosure, and the scope of the present disclosure is defined by the appended claims.

What is claimed is:

1. A stretchable display panel, comprising:
    a plurality of display islands arranged in an array and a plurality of stretch bridges each connecting to two adjacent display islands; and
    a display function layer, a first organic padding layer disposed on the display island, and a touch electrode layer, wherein:
        the display function layer and the touch electrode layer are both disposed on a display island of the plurality of display islands;
        an orthographic projection of the touch electrode layer on the display island at least partially surrounds an orthographic projection of the display function layer on the display island;
        the first organic padding layer is located between the touch electrode layer and the display islands; and
        an orthographic projection of the first organic padding layer on the display island at least partially surrounds and does not overlap the orthographic projection of the display function layer on the display island.

2. The stretchable display panel according to claim 1, wherein:
    the display function layer includes at least one inorganic layer, and the touch control electrode layer is not in contact with the at least one inorganic layer in the display function layer.

3. The stretchable display panel according to claim 2, wherein:
    the orthographic projection of the touch electrode layer on the display island does not overlap an orthographic projection of the inorganic layer in the display function layer on the display island.

4. The stretchable display panel according to claim 1, wherein:
    a first spacing is included between the orthographic projection of the touch electrode layer on the display island and the orthographic projection of the display function layer on the display island.

5. The stretchable display panel according to claim 4, wherein:
    along a direction from the touch electrode layer to the display function layer, a width of the first spacing is D, wherein D≥5 μm.

6. The stretchable display panel according to claim 1, wherein the orthographic projection of the first organic padding layer on the display island at least partially overlaps the orthographic projection of the touch electrode layer on the display island; and at least a part of the touch electrode layer is at a side of the first organic padding layer away from the display island.

7. The stretchable display panel according to claim 6, wherein:
along a direction perpendicular to the display island, a height of the first organic padding layer is greater than or equal to a height of the display function layer.

8. The stretchable display panel according to claim 6, further including:
a first signal line electrically connected to the touch electrode layer, wherein at least a part of the first signal line extends from the stretch bridge to the display island, and at least extends to a sidewall of the first organic padding layer.

9. The stretchable display panel according to claim 8, further including:
a second signal line electrically connected to the display function layer, wherein at least a part of the second signal line extends from the stretch bridge to the display island; and at least a part of the second signal line that is on the display island is at a side of the first organic padding layer adjacent to the display island.

10. The stretchable display panel according to claim 9, wherein:
at least a part of the stretch bridge is disposed with both the first signal line and the second signal line; and the first signal line and the second signal line are disposed at different layers.

11. The stretchable display panel according to claim 10, wherein:
along a direction perpendicular to an extending direction of the stretch bridge, the first signal line and the second signal line are separated by an organic insulation layer.

12. The stretchable display panel according to claim 6, further including:
at least one second organic padding layer disposed on the display island, wherein an orthographic projection of the second organic padding layer on the display island at least partially surrounds the orthographic projection of the display function layer on the display island;
the at least one second organic padding layer is at a side of the first organic padding layer away from the display function layer; the orthographic projection of the first organic padding layer on the display island at least partially overlaps the orthographic projection of the touch electrode layer on the display island; and at least a part of the touch electrode layer is at a side of the at least one second organic padding layer away from the display island.

13. The stretchable display panel according to claim 12, wherein:
the touch electrode layer includes touch control electrodes; and at a same display island, a touch control electrode at the side of the first organic padding layer away from the display island and a touch control electrode at the side of the second organic padding layer away from the display island are electrically connected with each other.

14. The stretchable display panel according to claim 12, wherein:
along a direction perpendicular to the display island, a height of the first organic padding layer is same as a height of the second organic padding layer.

15. The stretchable display panel according to claim 1, further including:
a first substrate, wherein the display island and the stretch bridge are both formed on the first substrate.

16. The stretchable display panel according to claim 15, further including:
a second substrate disposed between the first substrate and the display island, wherein the first substrate is a whole-surface deposited structure, and the second substrate is disposed with a plurality of hollowed structures; and orthographic projections of the display island and the stretch bridge on the first substrate are within an orthographic projection of a non-hollowed portion of the second substrate on the first substrate.

17. The stretchable display panel according to claim 2, wherein:
the display function layer includes a drive circuit layer, a light-emitting layer, and an encapsulation layer; along a direction perpendicular to the display island, the light-emitting layer is between the drive circuit layer and the encapsulation layer; the encapsulation layer is at a side of the light-emitting layer away from the display island; and at least one of the drive circuit layer and the encapsulation layer includes the at least one inorganic layer.

18. The stretchable display panel according to claim 2, wherein:
the display function layer includes a drive circuit layer and a light-emitting element at a side of the drive circuit layer away from the display island; the light-emitting element is at least one of a micro light-emitting diode (LED) and a mini LED; and at least one of the drive circuit layer and the light-emitting element includes the at least one inorganic layer.

19. A display device, comprising:
a stretchable display panel, comprising:
a plurality of display islands arranged in an array and a plurality of stretch bridges each connecting to two adjacent display islands;
a display function layer, a first organic padding layer disposed on the display island, and a touch electrode layer, wherein:
the display function layer and the touch electrode layer are both disposed on a display island of the plurality of display islands; and
an orthographic projection of the touch control electrode layer on the display island at least partially surrounds an orthographic projection of the display function layer on the display island;
the first organic padding layer is located between the touch electrode layer and the display islands; and
an orthographic projection of the first organic padding layer on the display island at least partially surrounds and does not overlap the orthographic projection of the display function layer on the display island.

* * * * *